US010691028B2

(12) United States Patent
Heo et al.

(10) Patent No.: US 10,691,028 B2
(45) Date of Patent: Jun. 23, 2020

(54) OVERLAY VARIANCE STABILIZATION METHODS AND SYSTEMS

(71) Applicant: KLA-Tencor Corporation, Milpitas, CA (US)

(72) Inventors: Hoyoung Heo, Gyeonggi-do (KR); William Pierson, Austin, TX (US); Jeremy Nabeth, Austin, TX (US); Sanghuck Jeon, Gyeonggi-do (KR); Onur N. Demirer, Austin, TX (US); Miguel Garcia-Medina, Austin, TX (US); Soujanya Vuppala, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 693 days.

(21) Appl. No.: 15/256,410

(22) Filed: Sep. 2, 2016

(65) Prior Publication Data

US 2017/0219928 A1    Aug. 3, 2017

Related U.S. Application Data

(60) Provisional application No. 62/290,185, filed on Feb. 2, 2016.

(51) Int. Cl.
*G06F 17/50* (2006.01)
*G03F 7/20* (2006.01)

(52) U.S. Cl.
CPC .......... *G03F 7/705* (2013.01); *G03F 7/70633* (2013.01)

(58) Field of Classification Search
CPC ............................. G03F 7/705; G03F 7/70633
(Continued)

(56) References Cited

U.S. PATENT DOCUMENTS 6,535,774 B1   3/2003   Bode et al.
6,893,786 B2   5/2005   Baggenstoss
(Continued)

FOREIGN PATENT DOCUMENTS

EP   1626310 A1   2/2006
EP   1975723 A1   3/2006
(Continued)

OTHER PUBLICATIONS

International Search Report dated May 10, 2017 for PCT/US2017/015063.
(Continued)

*Primary Examiner* — Jack Chiang
*Assistant Examiner* — Brandon Bowers
(74) *Attorney, Agent, or Firm* — Suiter Swantz pc llo

(57) ABSTRACT

Methods and systems for providing overlay corrections are provided. A method may include: selecting an overlay model configured to perform overlay modeling for a wafer; obtaining a first set of modeled results from the overlay model, the first set of modeled results indicating adjustments applicable to a plurality of term coefficients of the overlay model; calculating a significance matrix indicating the significance of the plurality of term coefficients; identifying at least one less significant term coefficient among the plurality of term coefficients based on the calculated significance matrix; obtaining a second set of modeled results from the overlay model, the second set of modeled results indicating adjustments applicable to the plurality of term coefficients except for the identified at least one less significant term coefficient; and providing the second set of modeled results to facilitate overlay correction.

16 Claims, 7 Drawing Sheets

(58) Field of Classification Search
USPC .......................................................... 716/51
See application file for complete search history.

(56) References Cited

U.S. PATENT DOCUMENTS

| | | |
|---|---|---|
| 7,261,985 B2 | 8/2007 | Smith et al. |
| 7,288,779 B2 | 10/2007 | Schets et al. |
| 7,508,976 B1 | 3/2009 | Yang et al. |
| 7,538,344 B2 | 5/2009 | Mellinger et al. |
| 7,783,444 B2 | 8/2010 | Habets et al. |
| 7,804,994 B2 | 9/2010 | Adel et al. |
| 8,874,249 B2 | 10/2014 | Ausschnitt |
| 2005/0095515 A1* | 5/2005 | Pellegrini ............... G03F 7/705 430/30 |
| 2006/0050953 A1 | 3/2006 | Farmer et al. |
| 2008/0201117 A1 | 8/2008 | Wong et al. |
| 2010/0028790 A1 | 2/2010 | Seltmann et al. |
| 2011/0125440 A1 | 5/2011 | Lee et al. |
| 2014/0065733 A1 | 3/2014 | Ausschnitt |
| 2015/0316490 A1 | 11/2015 | Amit et al. |

FOREIGN PATENT DOCUMENTS

| | | |
|---|---|---|
| KR | 20100078603 A | 7/2010 |
| KR | 20110095703 A | 8/2011 |
| WO | 2010086068 A2 | 8/2010 |
| WO | 2014138522 A1 | 9/2014 |
| WO | 2015006233 A1 | 1/2015 |

OTHER PUBLICATIONS

Office Action dated Mar. 5, 2020 for CN Application No. 201780021326.4.

* cited by examiner

OVERLAY VARIANCE STABILIZATION METHODS AND SYSTEMS

CROSS-REFERENCE TO RELATED APPLICATIONS

The present application claims the benefit under 35 U.S.C. § 119(e) of U.S. Provisional Application Ser. No. 62/290,185, filed Feb. 2, 2016. Said U.S. Provisional Application Ser. No. 62/290,185 is hereby incorporated by reference in its entirety.

TECHNICAL FIELD

The disclosure generally relates to the field of correction methods and systems, and particularly to overlay correction methods and systems.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Fabricating semiconductor devices typically includes processing a substrate such as a semiconductor wafer using a number of semiconductor fabrication processes. Metrology processes are used at various steps during the semiconductor manufacturing process to monitor and control one or more semiconductor layer processes. One of the characteristics being monitored and controlled is the overlay error. An overlay measurement generally specifies how accurately a first patterned layer aligns with respect to a second patterned layer disposed above or below it or how accurately a first pattern aligns with respect to a second pattern disposed on the same layer. The overlay error may be determined with an overlay target having structures formed on one or more layers of a work piece (e.g., semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

When overlay errors are observed, an overlay measurement may be used to apply corrections to keep overlay errors within desired limits. For example, overlay measurements may be fed into an analysis routine that can calculate applicable scanner corrections to better align the process tools (e.g., a lithography tool) used in the fabrication process.

Overlay errors are typically corrected using fixed models such as linear models, high order correction (HOPC) models, intra-field high order correction (i-HOPC) models, Cascade models, Zernike models, Legendre models or the like. It is noted that linear and Cascade models are not sufficiently effective. HOPC and i-HOPC models, on the other hand, are not sufficiently robust. Therein lies a need for providing effective and robust overlay correction methods and systems.

SUMMARY

The present disclosure is directed to a method. The method may include: selecting an overlay model configured to perform overlay modeling for a wafer; obtaining a first set of modeled results from the overlay model, the first set of modeled results indicating adjustments applicable to a plurality of term coefficients of the overlay model; calculating a significance matrix indicating the significance of the plurality of term coefficients; identifying at least one less significant term coefficient among the plurality of term coefficients based on the calculated significance matrix; obtaining a second set of modeled results from the overlay model, the second set of modeled results indicating adjustments applicable to the plurality of term coefficients except for the identified at least one less significant term coefficient; and providing the second set of modeled results to facilitate overlay correction.

A further embodiment of the present disclosure is directed to a system. The system may include an overlay metrology tool configured to obtain metrology data from a set of wafers. The system may also include an analyzer in communication with the overlay metrology tool. The analyzer may be configured to: select an overlay model configured to perform overlay modeling for the set of wafers; obtain a first set of modeled results from the overlay model, the first set of modeled results indicating adjustments applicable to a plurality of term coefficients of the overlay model; calculate a significance matrix indicating the significance of the plurality of term coefficients; identify at least one less significant term coefficient among the plurality of term coefficients based on the calculated significance matrix; obtain a second set of modeled results from the overlay model, the second set of modeled results indicating adjustments applicable to the plurality of term coefficients except for the identified at least one less significant term coefficient; and provide the second set of modeled results to facilitate overlay correction.

An additional embodiment of the present disclosure is directed to a system. The system may include an overlay metrology tool configured to obtain metrology data from a set of wafers. The system may also include an analyzer in communication with the overlay metrology tool. The analyzer may be configured to: select a plurality of sampling points from the set of wafers and select an overlay model configured to perform overlay modeling based on the plurality of sampling points; obtain a first set of modeled results from the overlay model, the first set of modeled results indicating adjustments applicable to a plurality of term coefficients of the overlay model; calculate a significance matrix indicating the significance of the plurality of term coefficients; and modify the plurality of sampling points selected for overlay modeling based on the significance matrix.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure.

Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to methods and systems for providing overlay corrections. An overlay modeling method configured in accordance with embodiments of the present disclosure may utilize a significance matrix to help identify and remove/move modeling steps or weigh the terms of an overlay model to make the overlay model more robust for correcting overlay errors. The significance matrix, for instance, may be configured to predict the significance of model term coefficients using input information such as term coefficient, overlay measurement map (e.g., points per field, points per wafer, fields per wafer, and points per lot), estimated sigma, maximum or minimum value, probabilities of terms and the like. The significance matrix may also be configured to weigh, and/or facilitate automatic removal of, certain model terms from a base (first) model to help build a more robust (second) model. Because the significance matrix is not required to break any term correlations in the overlay model, the second model built in this manner can be both robust and stable. The second model may then be used to calculate a second coefficient set that can be used for scanner overlay correction.

Figure 1:
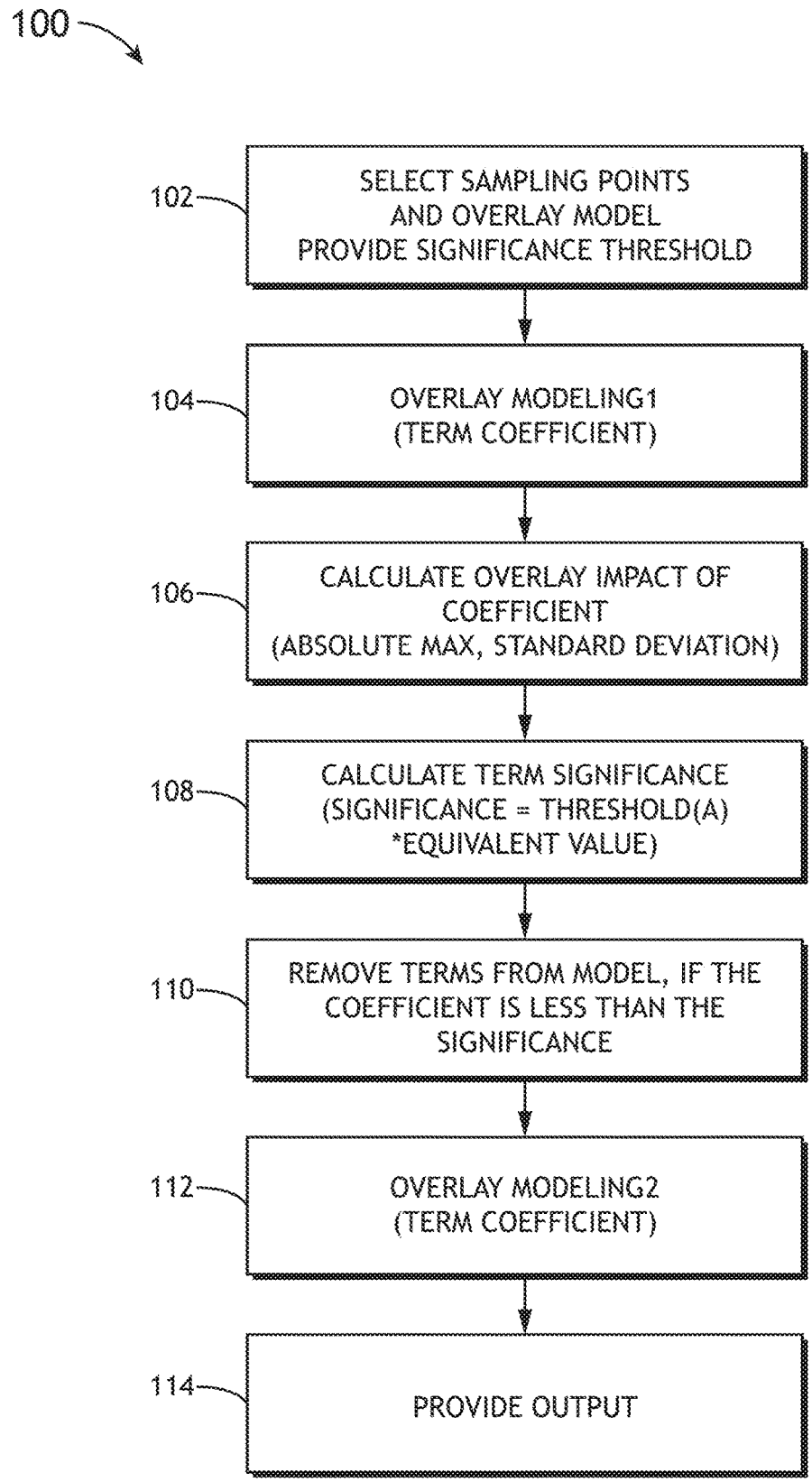
FIG. 1 is a flow diagram depicting an overlay modeling method configured in accordance with an embodiment of the present disclosure.

Referring now to FIG. 1, a flow diagram depicting an overlay modeling method 100 configured in accordance with an embodiment of the present disclosure is shown. The overlay modeling method 100 may start by selecting one or more sampling points in an initialization step 102. Alternatively, the full wafer map may be selected in the initialization step 102. The initialization step 102 may also select an overlay model that serves as the base (first) model. The base model may be selected from various types of overlay models, including, for example, linear models, high order correction (HOPC) models, intra-field high order correction (i-HOPC) models, Cascade models, Zernike models, Legendre models and the like. With the sampling points and the base overlay model selected, a first overlay modeling step 104 may be carried out and a first set of modeled results may be obtained accordingly. The first set of modeled results may indicate which term coefficients should be adjusted (and how they should be adjusted) to help correct overlay errors.

It is noted that also provided in the initialization step 102 is a threshold. This threshold may be utilized to help determine the significance of one or more term coefficients used in the base model. This threshold may therefore be referred to as a significance threshold.

In some embodiments, the significance of the term coefficients used in the base model is determined based on their impact on the modeled results. More specifically, as shown in FIG. 1, the impact of the various term coefficients used in the base model may be calculated in a step 106. The impact may be expressed in statistical terms such as absolute max, standard deviation and the like.

The significance of the term coefficients may then be calculated based on the impact in a step 108. The significance of the term coefficients may be collectively referred to as a significance matrix, which is understood to be an exemplary term and is not meant to be limiting. It is contemplated that the significance matrix may be referred to as a significance table or a significant record (among various other terms) without departing from the spirit and the scope of the present disclosure.

In some embodiments, if a particular term coefficient is determined to have a low impact on the modeled results, that particular term coefficient may be deemed less significant and may be removed from the base model in a step 110. It is contemplated that removing less significant term coefficients (e.g., below a certain threshold or ranked lower compared to other term coefficients) from the base model may help stabilize the overlay variance because a model with less term coefficients may be more stable. The base model with one or more term coefficients removed in this manner may be referred to as a second model, which may then be utilized to model the overlay again in a step 112 and provide a second set of modeled results in a step 114. Similar to the first set of modeled results, the second set of modeled results may also indicate which term coefficients should be adjusted (and how they should be adjusted) to help correct overlay errors. It is noted, however, that the second set of modeled results provided in the step 114 may be more robust and more stable compared to the first set of modeled results obtained using the based model.

It is also noted that while the significance of the term coefficients may be determined based on their impact on the modeled results, such a determination technique is merely exemplary and is not meant to be limiting. It is contemplated that the significance of the term coefficients may be determined utilizing other determination techniques without departing from the spirit and the scope of the present disclosure.

Figure 2:
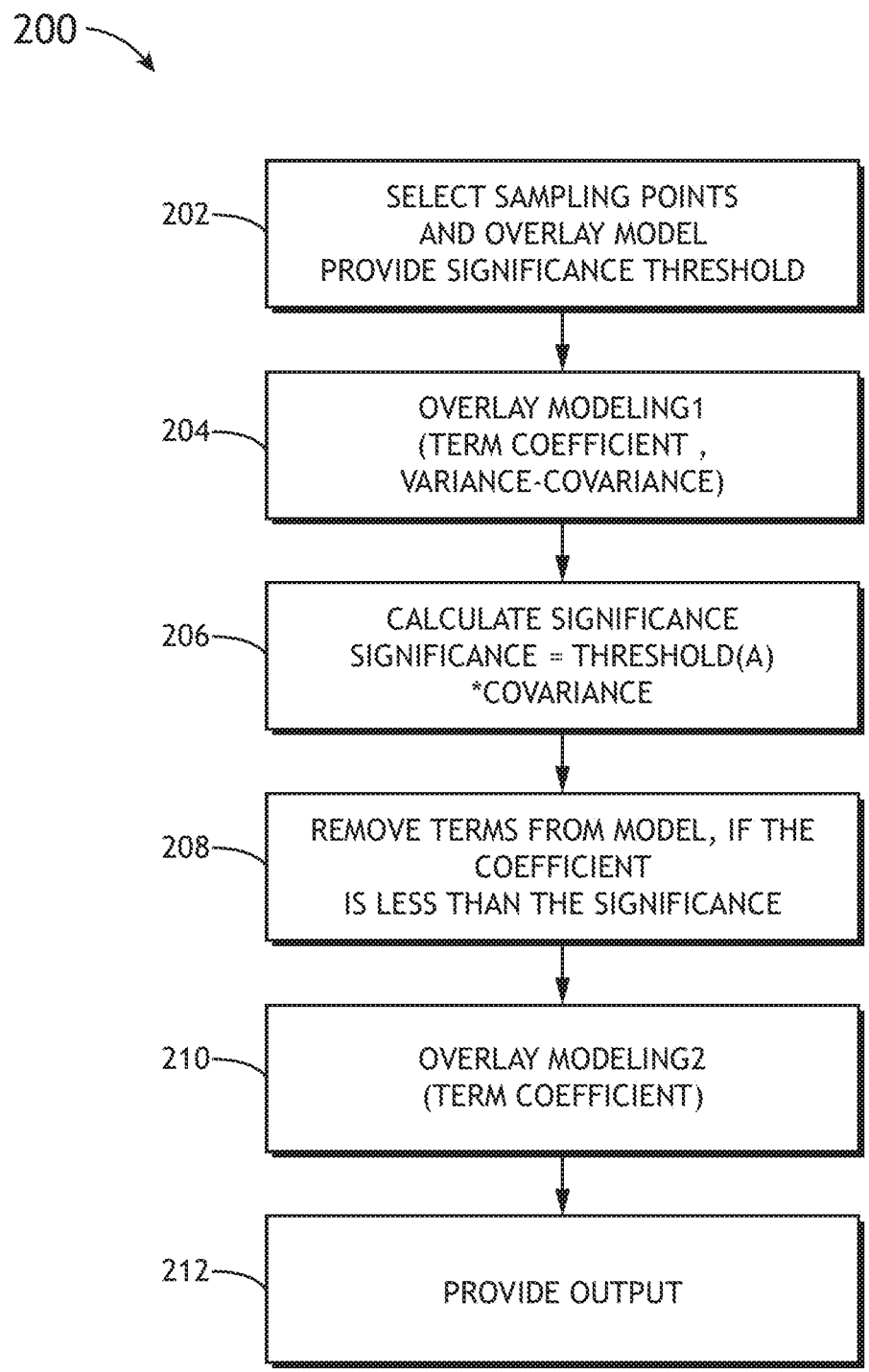
FIG. 2 is a flow diagram depicting another overlay modeling method configured in accordance with an embodiment of the present disclosure.

For instance, in some embodiments, the significance of the term coefficients may be determined based on t-statistics, term coefficient variance, and/or covariance, as shown in FIG. 2. More specifically, the overlay modeling method 200 may start by selecting a base model and one or more sampling points in an initialization step 202 and carrying out a first overlay modeling step 204 in a manner similar to that described above. The significance of the term coefficients may then be calculated based on t-statistics, variance, and/or covariance values of the term coefficients in a step 206. It is noted that a covariance value of a particular term coefficient may indicate the sensitivity of that particular term coefficient to variations in data and provide a confidence level in the term coefficient. A high covariance value, for example, may indicate a low sensitivity. A low covariance value, on the other hand, may indicate a high sensitivity. If a term coefficient varies over multiple lot runs and its covariance value is high, such a term coefficient may be deemed less significant and making a correction based on such a term coefficient may not yield significant improvements in overlay errors. Term coefficients identified as such may, therefore, be removed from the base model in a step 208 to build a second model, which may then be utilized to model the overlay again in a step 210 and provide a second set of modeled results in a step 214.

Figure 3:
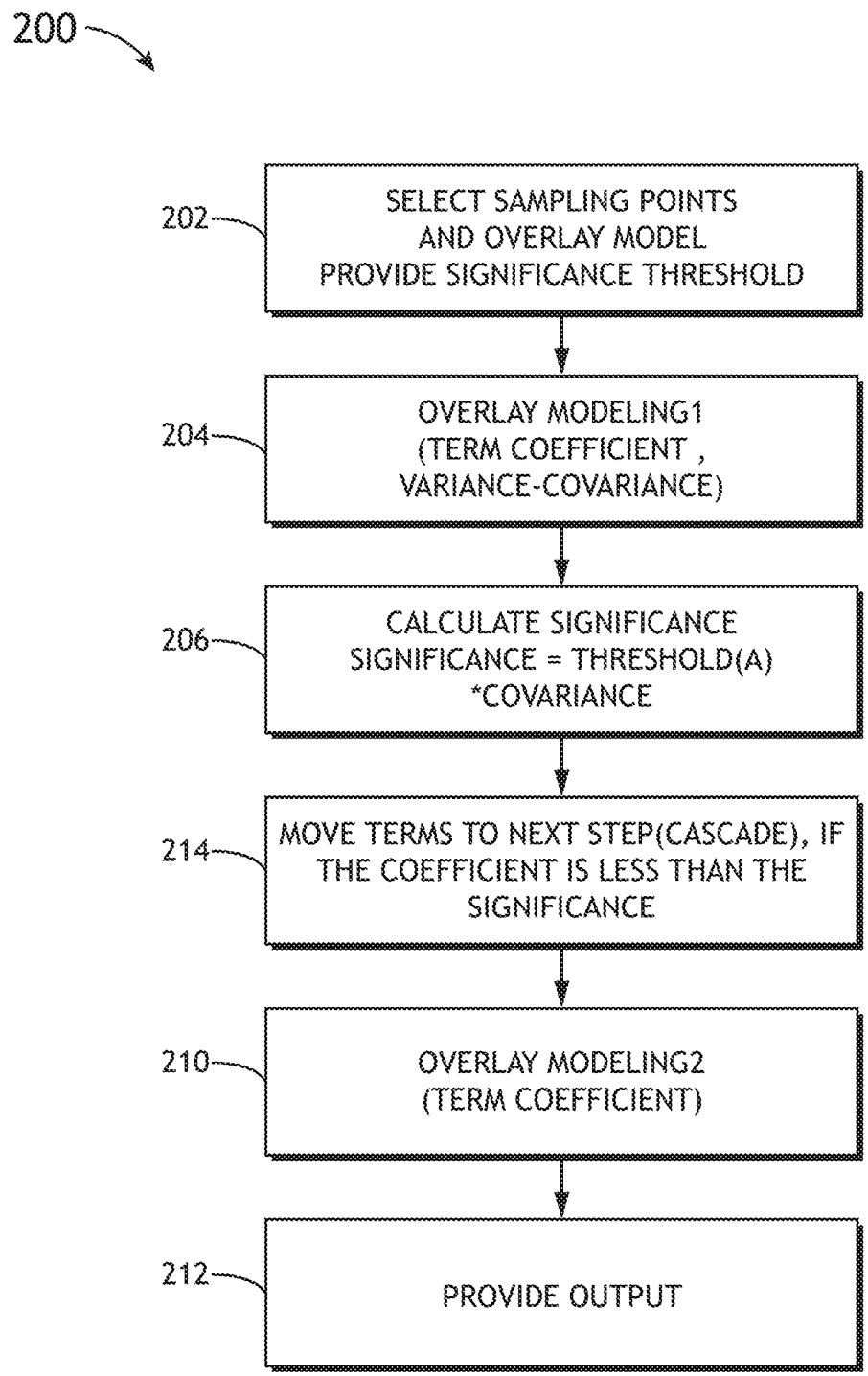
FIG. 3 is a flow diagram depicting another overlay modeling method configured in accordance with an embodiment of the present disclosure.
Figure 4:
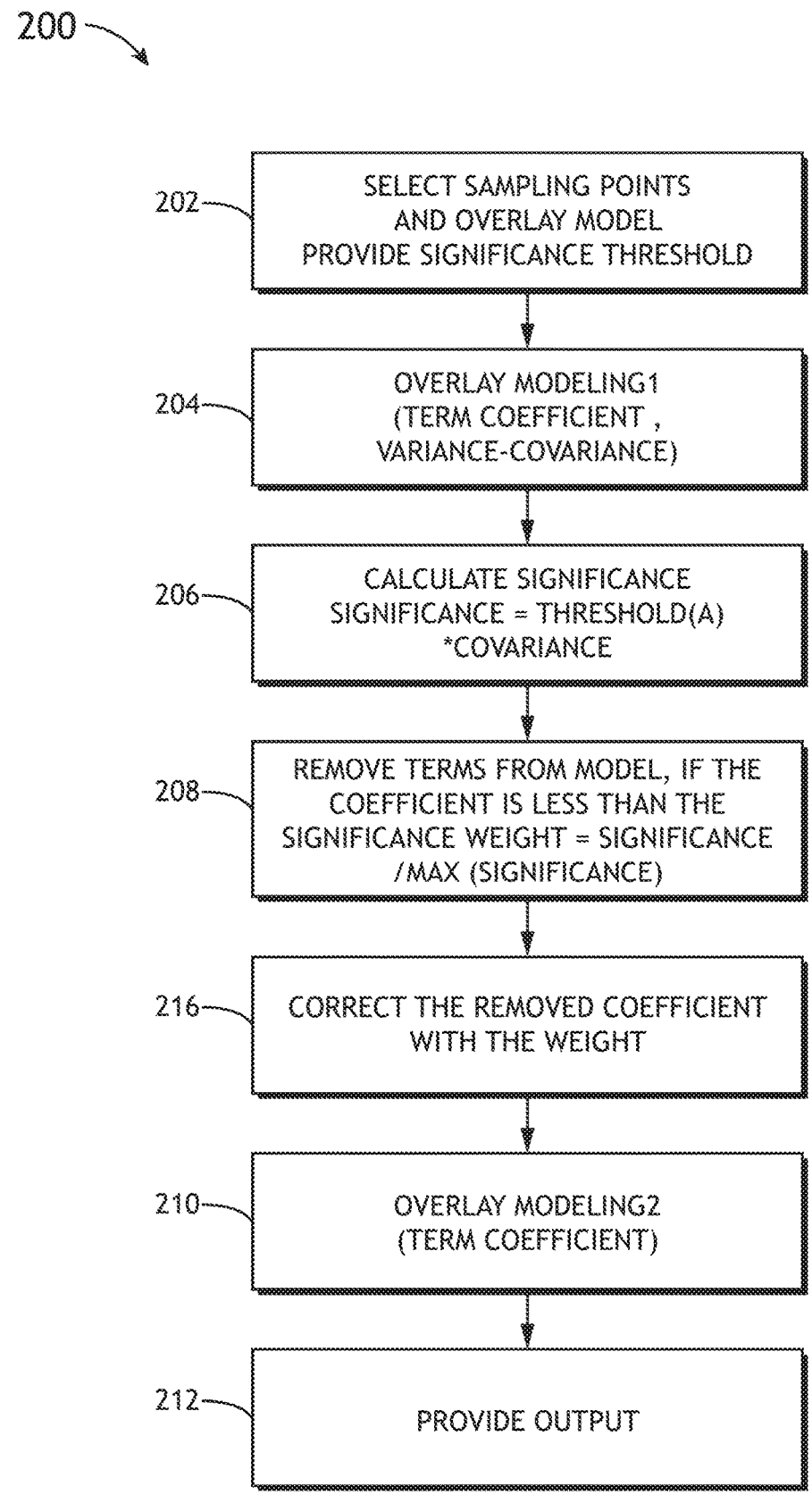
FIG. 4 is a flow diagram depicting another overlay modeling method configured in accordance with an embodiment of the present disclosure.

Alternatively, in some embodiments, instead of removing the term coefficients that are deemed less significant, these term coefficients may be cascaded automatically in a step 214 as shown in FIG. 3. The second model built in this manner may be configured to separately model the remaining term coefficients and leave the cascaded term coefficients un-modeled. In other embodiments, as shown in FIG. 4, the removed term coefficients may be weighted (e.g., based on their corresponding significance) in the step 208 and the weight may be utilized to help correct the removed term coefficients.

Figure 5:
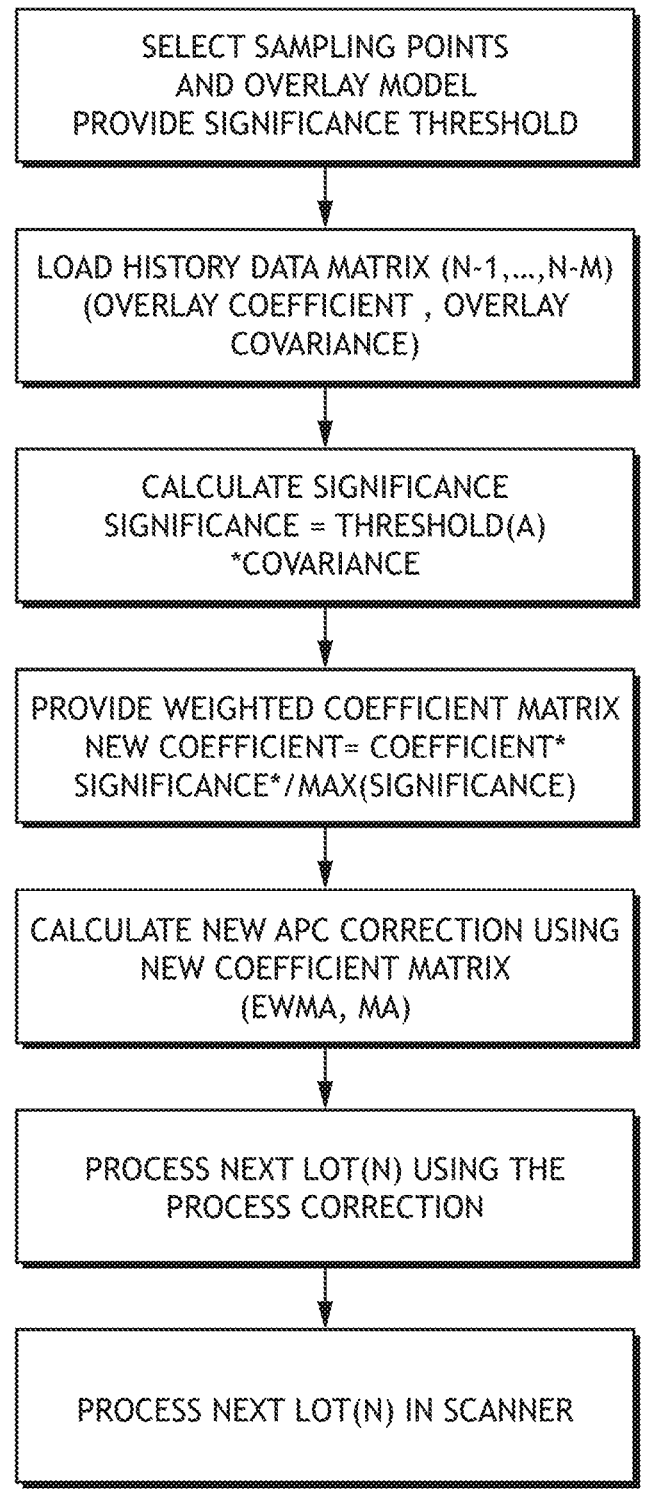
FIG. 5 is a flow diagram depicting utilization of determined significance of the term coefficients to weight historical data.

Furthermore, in some embodiments, the significance of the term coefficients determined in accordance with embodiments of the present disclosure may be utilized to facilitate a feedback or a feed forward automated process control. For instance, as shown in FIG. 5, the significance of the term coefficients can be used to weight historical data (e.g., collected from previous lots) so that the process correction value can be modified. It is contemplated that utilizing the significance of the term coefficients in this manner may effectively enable a statistical process control mechanism that may be appreciated in various stages of the fabrication process, including, for example, correction per exposure modeling and/or alignment control for scanners and the like.

Figure 6:
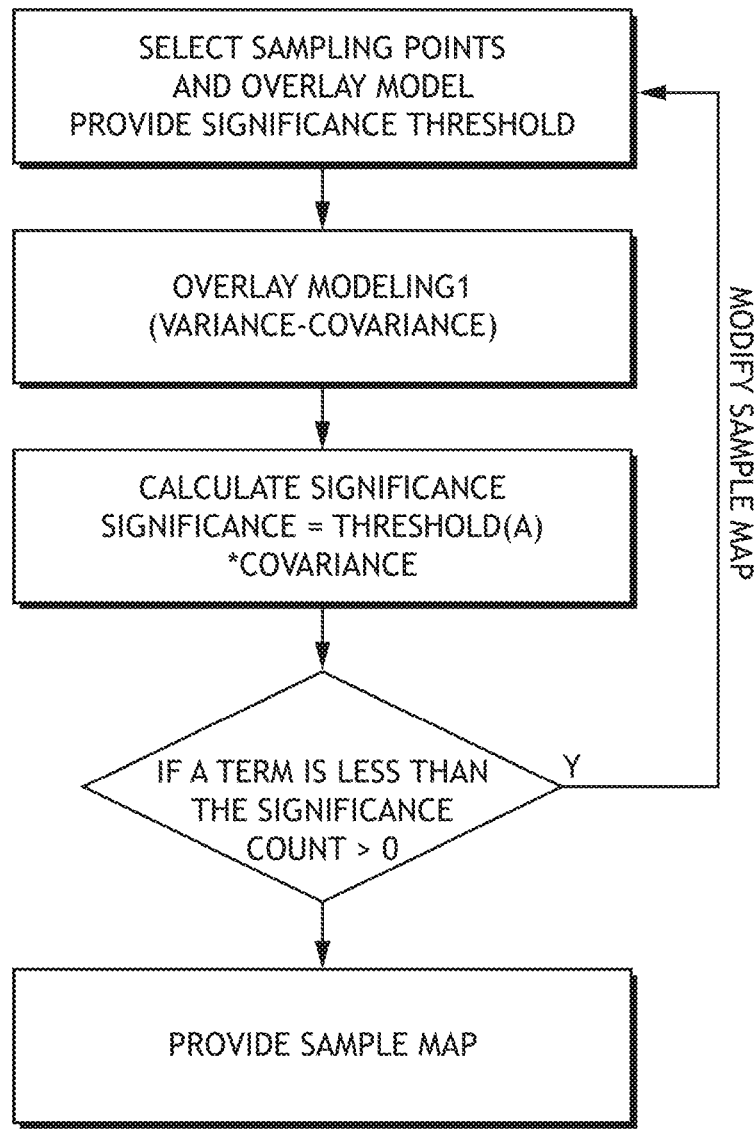
FIG. 6 is a flow diagram depicting utilization of determined significance of the term coefficients to determine whether or not to modify sample points.

It is contemplated that the significance of the term coefficients determined in accordance with embodiments of the present disclosure may also be utilized to help modify the sampling points initially selected in the initialization step (depicted as the step 102/202 above). For instance, as shown in FIG. 6, the significance of the term coefficients can be utilized to determine whether or not the sample points initially selected in the initialization step meet a certain requirement. Suppose, for example, if a term coefficient shows large variations (e.g., above a certain threshold), it may be beneficial to reduce the variance by selecting a different set of sampling points. It is to be understood that this selection process may be carried out automatically to help stabilize the overlay model. It is also to be understood that this selection process may be configured to be optional without departing from the spirit and the scope of the present disclosure.

As will be appreciated from the above, overlay modeling methods configured in accordance with embodiments of the present disclosure can utilize the significance of the term coefficients to help identify and remove/move modeling steps or weigh the terms of overlay models to make the overlay models more robust and more stable. The significance of the term coefficients (also known as the significance matrix in accordance with the present disclosure) may also be utilized to test the sampling points as a way to further improve the robustness of the overlay model and to further reduce overlay variations.

It is contemplated that overlay modeling methods configured in accordance with embodiments of the present disclosure may work particularly well with orthogonal models such as Zernike and Legendre models because while removing some of the terms may impact the values of other terms for a regular non-orthogonal model (e.g., linear, HOPC or i-HOPC models), this impact may be minimized for an orthogonal model. It is noted that overlay modeling methods configured in accordance with embodiments of the present disclosure do not need to break any term correlations in the underlying base model—only term coefficients are modified—making the overlay modeling methods easy to implement and shortening the cycle time needed to build a robust model. It is also noted that because overlay modeling methods configured in accordance with embodiments of the present disclosure can support automated process control techniques commonly used in semiconductor device manufacturing, machine variations (e.g., scanner, metrology, wafer deformation, chemical mechanical polishing profile and the like) can be effectively controlled/reduced to improve device yield in semiconductor device manufacturing.

Figure 7:
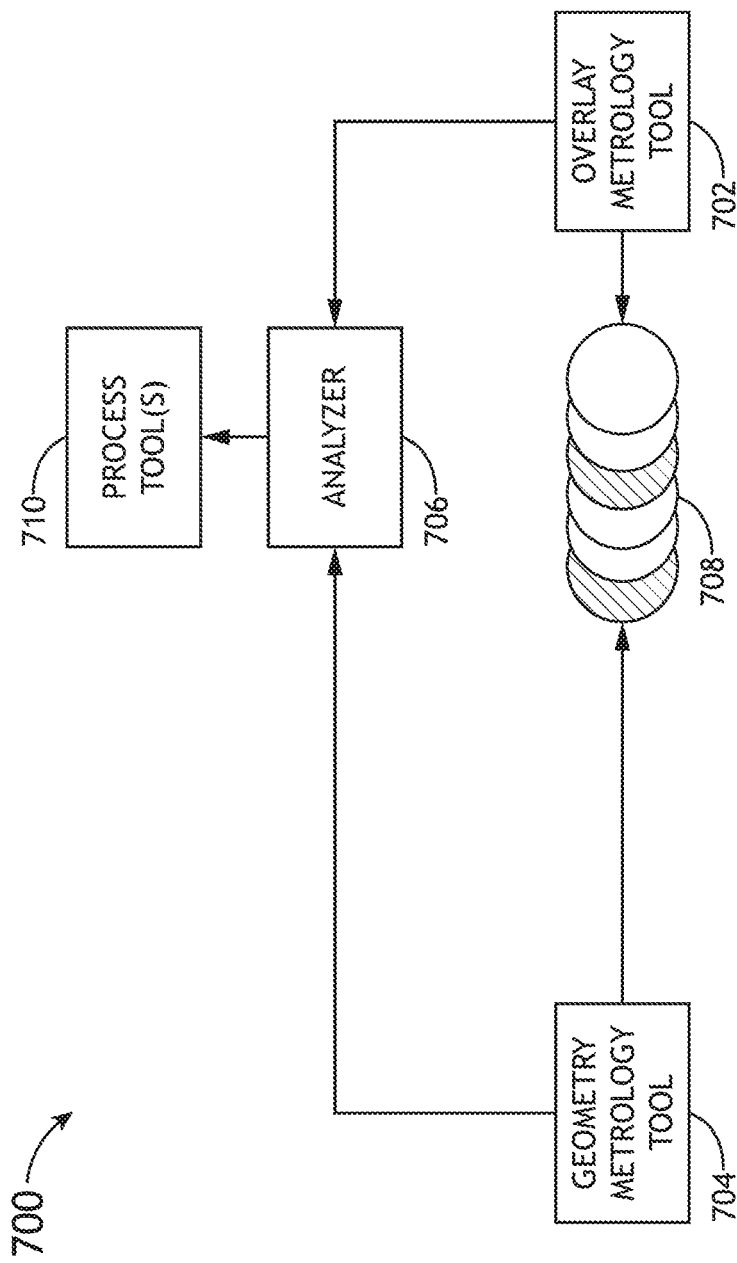
FIG. 7 is a block diagram depicting an overlay correction system configured in accordance with an embodiment of the present disclosure.

Referring now to FIG. 7, a block diagram depicting an overlay correction system 700 configured in accordance with embodiments of the present disclosure is shown. The system 700 may include an overlay metrology tool 702 configured to collect raw overlay signatures. The system 700 may also include a geometry metrology tool 704 configured to collect wafer geometry data from a set of wafers 708. The geometry metrology tool 704 may include a wafer geometry tool or any imaging device capable of collecting wafer geometry data, such as WaferSight metrology system from KLA-Tencor. It is to be understood that the overlay metrology tool 702 and the geometry metrology tool 704 may be implemented as separate devices. Alternatively, an integrated metrology system capable of measuring patterned wafers may be utilized for both overlay metrology and wafer geometry measurement.

The system 700 may also include an analyzer 706 in communication with both the overlay metrology tool 702 and the geometry metrology tool 704. The analyzer 706 may be implemented on a computer processor, a circuitry or the like, that is capable of carrying out the various significance matrix based modeling processes previously described. In some embodiments, the analyzer 706 may also be configured to facilitate a feedback or a feed forward control of one or more process tools (e.g., a scanner, a metrology tool, a chemical mechanical polishing tool or the like) 710 as described above.

It is contemplated that while some of the examples above referred to certain specific process tools, the systems and methods in accordance with the present disclosure are applicable to other types of process tools, which may also benefit from improved overlay control without departing from the spirit and scope of the present disclosure. In addition, it is contemplated that while the examples above referred to wafers, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is contemplated that the methods described in the present disclosure may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method, comprising:
    selecting an overlay model configured to perform overlay modeling for a wafer;
    obtaining a first set of modeled results from the overlay model, the first set of modeled results indicating adjustments applicable to a plurality of term coefficients of the overlay model;
    calculating a significance matrix indicating the significance of the plurality of term coefficients;
    identifying at least one less significant term coefficient among the plurality of term coefficients based on the calculated significance matrix;
    obtaining a second set of modeled results from the overlay model, the second set of modeled results indicating adjustments applicable to the plurality of term coefficients excluding the identified at least one less significant term coefficient;
    weighting the at least one less significant term coefficient;
    correcting the at least one less significant term coefficient based on the weighting of the at least one less significant term coefficient; and
    providing the second set of modeled results and the corrected the at least one less significant term coefficient to facilitate overlay correction.

2. The method of claim 1, wherein the significance matrix is calculated at least partially based on an impact of each term coefficient on the first set of modeled results.

3. The method of claim 1, wherein the significance matrix is calculated at least partially based on a variance and a covariance of each term coefficient.

4. The method of claim 1, wherein the identified at least one less significant term coefficient is cascaded and provided along with the second set of modeled results to facilitate overlay correction.

5. The method of claim 1, further comprising:
    providing a feedback or a feed forward control of at least one process tool based on the significance matrix.

6. The method of claim 1, wherein the overlay modeling is performed based on a plurality of sampling points selected for the wafer.

7. The method of claim 6, further comprising:
    modifying the plurality of sampling points selected based on the significance matrix.

8. The method of claim 1, wherein the overlay model is an orthogonal model.

9. A system, comprising:
    an overlay metrology tool configured to obtain metrology data from a set of wafers; and
    an analyzer in communication with the overlay metrology tool, the analyzer configured to:
        select an overlay model configured to perform overlay modeling for the set of wafers;
        obtain a first set of modeled results from the overlay model, the first set of modeled results indicating adjustments applicable to a plurality of term coefficients of the overlay model;
        calculate a significance matrix indicating the significance of the plurality of term coefficients;
        identify at least one less significant term coefficient among the plurality of term coefficients based on the calculated significance matrix;
        obtain a second set of modeled results from the overlay model, the second set of modeled results indicating adjustments applicable to the plurality of term coefficients excluding the identified at least one less significant term coefficient;
        weight the at least one less significant term coefficient;
        correct the at least one less significant term coefficient based on the weighting of the at least one less significant term coefficient; and
        provide the second set of modeled results and the corrected the at least one less significant term coefficient to facilitate overlay correction.

10. The system of claim 9, wherein the analyzer is configured to calculate the significance matrix at least partially based on an impact of each term coefficient on the first set of modeled results.

11. The system of claim 9, wherein the analyzer is configured to calculate the significance matrix at least partially based on a variance and a covariance of each term coefficient.

12. The system of claim 9, wherein the analyzer is configured to cascade the identified at least one less significant term coefficient and provide the identified at least one less significant term coefficient along with the second set of modeled results to facilitate overlay correction.

13. The system of claim 9, wherein the analyzer is further configured to provide a feedback or a feed forward control to at least one process tool based on the significance matrix.

14. The system of claim 9, wherein the overlay modeling is performed based on a plurality of sampling points selected for the set of wafers.

15. The system of claim 14, wherein the analyzer is further configured to modify the plurality of sampling points selected based on the significance matrix.

16. The system of claim 9, wherein the overlay model is an orthogonal model.

* * * * *